(12) United States Patent
Scheuerlein et al.

(10) Patent No.: US 8,138,010 B2
(45) Date of Patent: *Mar. 20, 2012

(54) METHOD FOR FABRICATING HIGH DENSITY PILLAR STRUCTURES BY DOUBLE PATTERNING USING POSITIVE PHOTORESIST

(75) Inventors: Roy E. Scheuerlein, Cupertino, CA (US); Steven Radigan, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/070,825

(22) Filed: Mar. 24, 2011

(65) Prior Publication Data

US 2011/0171809 A1     Jul. 14, 2011

Related U.S. Application Data

(63) Continuation of application No. 12/777,046, filed on May 10, 2010, now Pat. No. 7,935,553, which is a continuation of application No. 12/216,108, filed on Jun. 30, 2008, now Pat. No. 7,732,235.

(51) Int. Cl.
*H01L 21/00* (2006.01)

(52) U.S. Cl. .......... 438/66; 438/703; 438/700; 438/153; 438/381; 257/E45.002; 257/E21.214; 257/352

(58) Field of Classification Search .................. 257/352, 257/361, E21.17; 438/703, 700, 706, 745, 438/637, 672, 597, 153
See application file for complete search history.

(56) References Cited

U.S. PATENT DOCUMENTS

| | | | |
|---|---|---|---|
| 5,024,971 A | 6/1991 | Baker et al. | |
| 5,482,885 A | 1/1996 | Lur et al. | |
| 5,739,068 A | 4/1998 | Jost et al. | |
| 5,915,167 A | 6/1999 | Leedy | |
| 5,977,638 A | 11/1999 | Rodgers et al. | |

(Continued)

FOREIGN PATENT DOCUMENTS

EP    0 288 739 A2    11/1988

(Continued)

OTHER PUBLICATIONS

International Search Report and Written Opinion, Intl. Application PCT/US2009/048584, International Search Authority: European Patent Office (EPO), Jan. 15, 2010.

(Continued)

*Primary Examiner* — Fernando L Toledo
*Assistant Examiner* — Mark A Laurenzi
(74) *Attorney, Agent, or Firm* — The Marbury Law Group, PLLC

(57) ABSTRACT

A method of making a semiconductor device includes forming a first photoresist layer over an underlying layer, patterning the first photoresist layer into a first photoresist pattern, wherein the first photoresist pattern comprises a plurality of spaced apart first photoresist features located over the underlying layer, and etching the underlying layer using the first photoresist pattern as a mask to form a plurality of first spaced apart features. The method further includes removing the first photoresist pattern, forming a second photoresist layer over the plurality of first spaced apart features, and patterning the second photoresist layer into a second photoresist pattern, wherein the second photoresist pattern comprises a plurality of second photoresist features covering edge portions of the plurality of first spaced apart features. The method also includes etching exposed portions of the plurality of first spaced apart features using the second photoresist pattern as a mask, such that a plurality of spaced apart edge portions of the plurality of first spaced apart features remain, and removing the second photoresist pattern.

20 Claims, 13 Drawing Sheets

U.S. PATENT DOCUMENTS

| | | | |
|---|---|---|---|
| 6,055,180 | A | 4/2000 | Gudesen et al. |
| 6,420,231 | B1 | 7/2002 | Harari et al. |
| 6,853,049 | B2 | 2/2005 | Herner |
| 6,855,614 | B2 | 2/2005 | Metzler |
| 6,946,719 | B2 | 9/2005 | Petti et al. |
| 6,952,030 | B2 | 10/2005 | Herner et al. |
| 7,081,377 | B2 | 7/2006 | Cleeves |
| 7,176,064 | B2 | 2/2007 | Herner |
| 7,211,866 | B2 | 5/2007 | Yuan et al |
| 7,271,057 | B2 | 9/2007 | Eppich |
| 2002/0052068 | A1* | 5/2002 | Juengling ............... 438/153 |
| 2002/0068436 | A1* | 6/2002 | Dakshina-Murthy et al. ............... 438/637 |
| 2003/0157436 | A1 | 8/2003 | Manger et al. |
| 2003/0178684 | A1 | 9/2003 | Nakamura |
| 2004/0245557 | A1 | 12/2004 | Seo et al. |
| 2005/0052915 | A1 | 3/2005 | Herner et al. |
| 2005/0226067 | A1 | 10/2005 | Herner et al. |
| 2006/0046206 | A1* | 3/2006 | Meagley et al. ............ 430/328 |
| 2006/0216937 | A1 | 9/2006 | Dunton et al. |
| 2006/0250836 | A1 | 11/2006 | Herner et al. |
| 2006/0250837 | A1 | 11/2006 | Herner et al. |
| 2006/0273298 | A1 | 12/2006 | Petti |
| 2007/0049035 | A1 | 3/2007 | Tran |
| 2007/0072360 | A1 | 3/2007 | Kumar et al. |
| 2007/0099431 | A1 | 5/2007 | Li |
| 2007/0114509 | A1* | 5/2007 | Herner ............... 257/4 |
| 2007/0158688 | A1 | 7/2007 | Caspary et al. |
| 2007/0164309 | A1 | 7/2007 | Kumar et al. |
| 2007/0176160 | A1 | 8/2007 | Uchiyama et al. |
| 2007/0197014 | A1 | 8/2007 | Jeon et al. |
| 2008/0013364 | A1 | 1/2008 | Kumar et al. |
| 2008/0014533 | A1 | 1/2008 | Keller et al. |
| 2008/0085600 | A1 | 4/2008 | Furukawa et al. |
| 2009/0085153 | A1 | 4/2009 | Maxwell et al. |
| 2009/0087963 | A1 | 4/2009 | Chen et al. |
| 2009/0149026 | A1 | 6/2009 | Zhou et al. |
| 2009/0155962 | A1 | 6/2009 | Petti et al. |
| 2009/0168480 | A1 | 7/2009 | Scheuerlein et al. |
| 2009/0170030 | A1 | 7/2009 | Scheuerlein et al. |
| 2009/0258318 | A1 | 10/2009 | Chan |
| 2009/0258501 | A1 | 10/2009 | Chan |
| 2009/0269932 | A1 | 10/2009 | Chen et al. |

FOREIGN PATENT DOCUMENTS

| | | | |
|---|---|---|---|
| EP | 1 818 977 | A2 | 8/2007 |

OTHER PUBLICATIONS

International Preliminary Report on Patentability, Intl. Application PCT/US2009/048584, International Preliminary Examination Authority: The International Bureau of WIPO, Jan. 13, 2011.

International Search Report and Written Opinion mailed Oct. 9, 2009, received in International application No. PCT/US2009/048581.

International Search Report and Written Opinion mailed Sep. 7, 2009, received in International application No. PCT/US2009/002400.

Invitation to Pay Additional Fees and Partial International Search Report mailed Oct. 21, 2009, received in International application No. PCT/US2009/048584.

Kim, Ryoung-han et al, "Double Exposure Using 193nm Negative Tone Photoresist", 2007, SPIE 6520-95, 8 pgs.

U.S. Appl. No. 09/560,626, filed Apr. 28, 2000, Knall.

Nakamura, Hiroko, et al., Contact Hole Formation by Multiple Exposure Technique in Ultra-low k Lithography, Proceedings of SPIE, vol. 5377, 2004m pp. 255-265.

Nakamura, Hiroko, et al., "Low k Contact Hole Formation by Double Line and Space Formation Method with Contact Hole Mask and Dipole Illumination", The Japan Society of Applied Physics, 2006, vol. 45, No. 6b, pp. 5409-5417.

Office Action mailed Jul. 22, 2009, recieved in U.S. Appl. No. 12/000,758.

Office Actions mailed Jul. 28, 2009 and Oct. 20, 2009, recieved in U.S. Appl. No. 12/149,151.

* cited by examiner

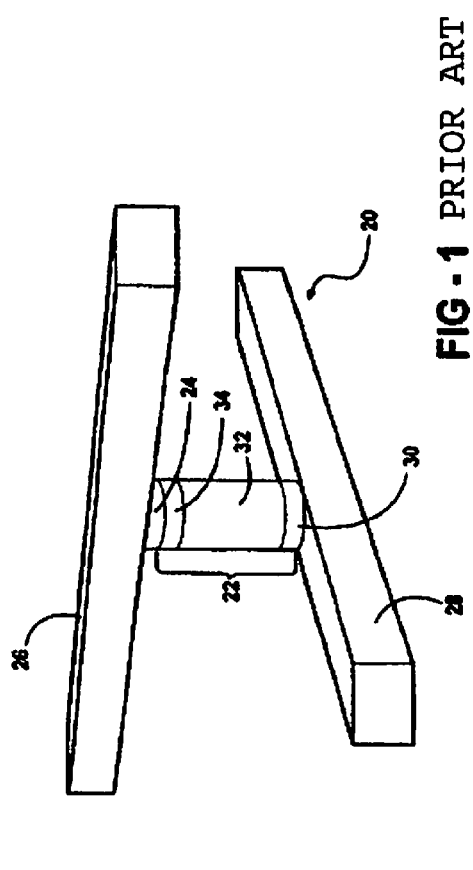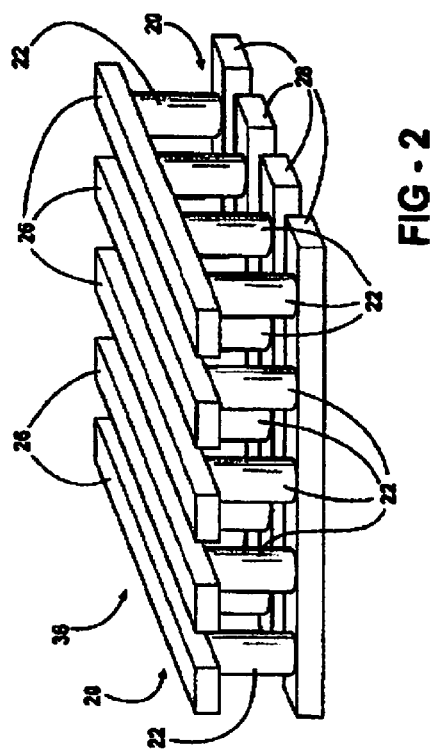
FIG - 1 PRIOR ART
FIG - 2

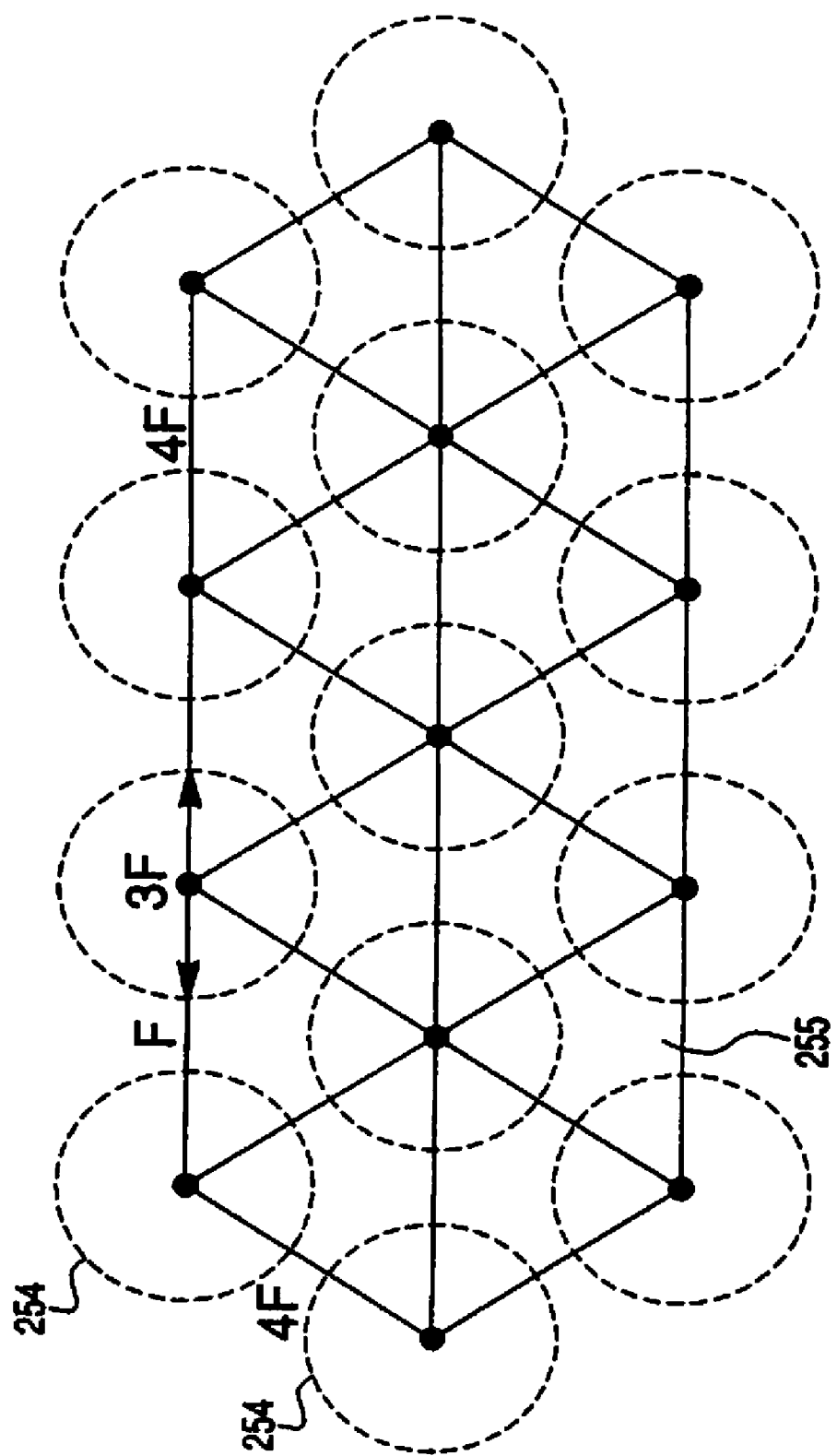

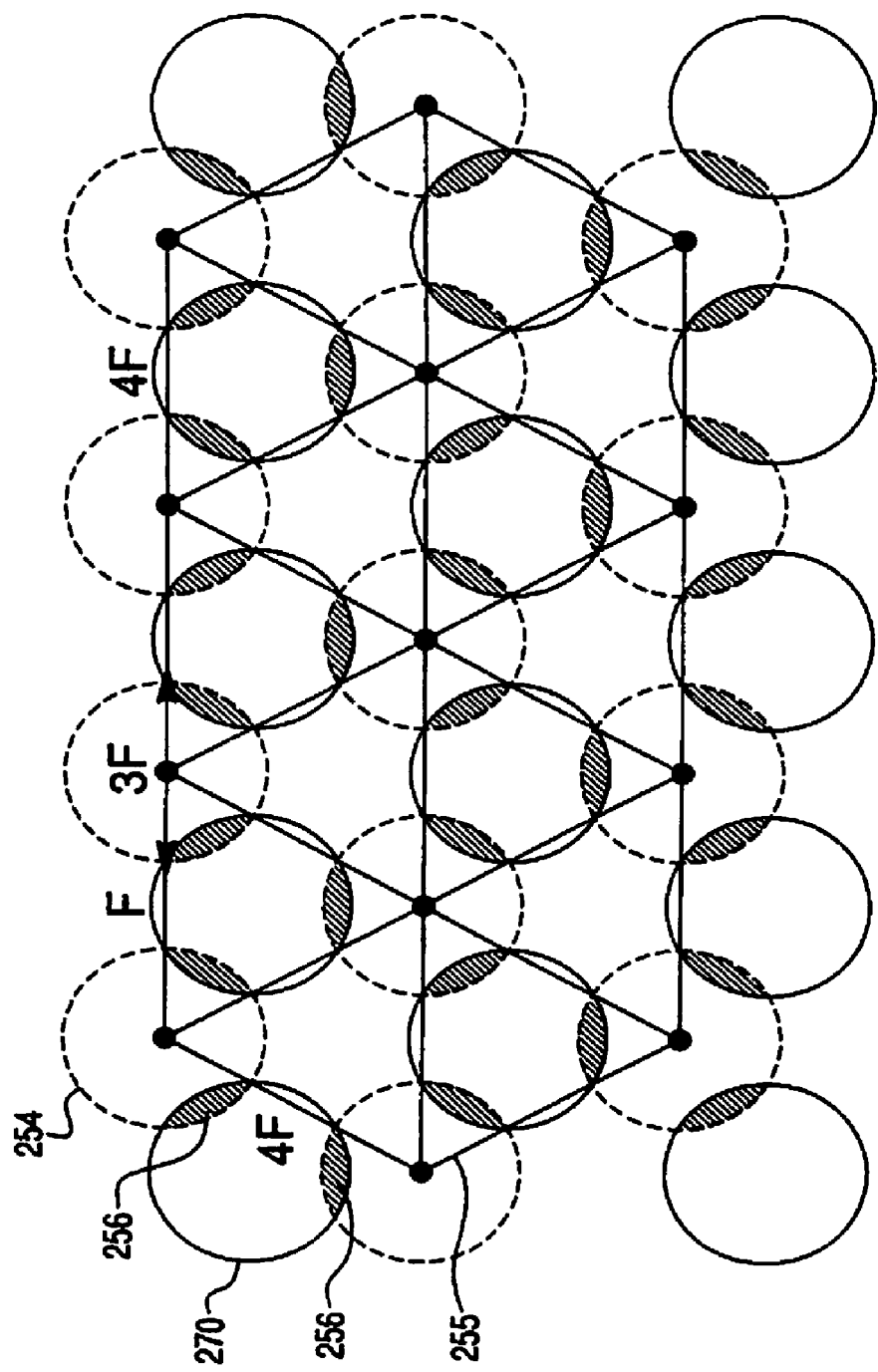

METHOD FOR FABRICATING HIGH DENSITY PILLAR STRUCTURES BY DOUBLE PATTERNING USING POSITIVE PHOTORESIST

The present application is a continuation of U.S. application Ser. No. 12/216,108, filed Jun. 30, 2008, the entire contents of which is incorporated herein by reference.

BACKGROUND

The invention generally relates to a method of making a semiconductor device, and more particularly, to a method of making semiconductor pillar structures.

Devices made from semiconductor materials are used to create memory circuits in electrical components and systems. Memory circuits are the backbone of such devices as data and instruction sets are stored therein. Maximizing the number of memory elements per unit area on such circuits minimizes their cost and thus is a primary motivation in the designing of such circuits.

As the dimensions for structures formed on a semiconductor wafer diminish, tools currently available to create these devices reach their limits. By way of example, currently available 193 nanometer immersion tools will fail to create structures with a pitch of less than about 80 nm (i.e., with a half pitch of less than about 40 nm). To fabricate features smaller than this with the currently available tools, one must use more complicated processes. One such process is the technique of double exposure/double patterning. Another is the use of sidewall spacers, formed on a template pattern which is then removed. The sidewall spacers are then used as mask during etching of the underlying film or films.

For simple, one-dimensional, regular line-and-space patterns, both of these techniques have the effect of dividing the photolithographically-produced pitch by two. In this way, the resolution capability of a given photolithography tool can be extended.

However, for a two-dimensional pattern of regularly-spaced pillars, the double-patterning scheme extends the pitch by a factor of the square root of 2. The sidewall spacer method, as-is, cannot be used at all since such a scheme would produce regularly spaced cylindrical annuli, rather than solid pillars.

SUMMARY

A method of making a semiconductor device includes forming a first photoresist layer over an underlying layer, patterning the first photoresist layer into a first photoresist pattern, wherein the first photoresist pattern comprises a plurality of spaced apart first photoresist features located over the underlying layer, and etching the underlying layer using the first photoresist pattern as a mask to form a plurality of first spaced apart features. The method further includes removing the first photoresist pattern, forming a second photoresist layer over the plurality of first spaced apart features, and patterning the second photoresist layer into a second photoresist pattern, wherein the second photoresist pattern comprises a plurality of second photoresist features covering edge portions of the plurality of first spaced apart features. The method also includes etching exposed portions of the plurality of first spaced apart features using the second photoresist pattern as a mask, such that a plurality of spaced apart edge portions of the plurality of first spaced apart features remain, and removing the second photoresist pattern.

A nonvolatile memory device includes a plurality of word lines extending in a first direction, a plurality of bit lines extending in a second direction, and a plurality of pillar shaped nonvolatile memory cells having an irregular oval cross sectional shape located between the word lines and the bit lines. The plurality of word lines comprise a set of first word lines and a set of second word lines. Each first word line is located between two second word lines and the first direction differs by about 60 degrees from the second direction. Each first word line electrically contacts twice as many memory cells as each second word line.

BRIEF DESCRIPTION OF THE DRAWINGS

FIG. 1 is a perspective view of a nonvolatile memory cell.

FIG. 2 is a perspective view of an array of memory cells of FIG. 1.

FIGS. 13, 14, 15, 16 and 17 are top views of process steps of making a device according to an alternative embodiment of the invention.

DETAILED DESCRIPTION OF THE EMBODIMENTS

Figure 3A:
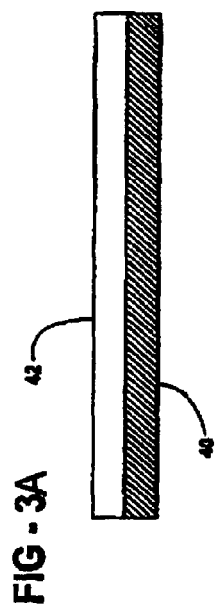
FIGS. 3A through 3D are cross-sectional side views illustrating steps in the process of forming conductive rails by a subtractive method.

The present inventors realized that a high density pillar array may be formed by a double patterning method if a first photoresist pattern is used as a mask to pattern a plurality of first spaced apart features, followed by forming a second photoresist pattern on these first spaced apart features such that the second photoresist pattern covers only the edge portions of the first spaced apart features. The first spaced apart features are then patterned using the second photoresist pattern as a mask, to leave a plurality of spaced apart edge portions of the plurality of first spaced apart features. The double patterned edge portions are smaller in size that the first spaced apart features and may either comprise a dense pillar array or be used as a masking layer for patterning of a dense underlying pillar array.

For example, one or more device layers are first formed over a substrate. Any suitable substrate may be used, such as a semiconductor wafer (including silicon or compound semiconductor wafers) or a metal, glass, ceramic or plastic substrate. The substrate may be covered by one or more insulating layers and/or one or more devices, such as driver circuits, which may be formed on or in the substrate. The device layers may comprise semiconductor layers for semiconductor devices, electrically conductive layer or layers which form electrodes, and/or insulating layers for isolation of the semiconductor or conductive portions of the devices.

A first photoresist layer is then formed either directly over the device layer(s) or over one or more masking layer(s) located over the device layer(s). As used herein, the device layer(s) and/or the masking layer(s) will be referred to as "an underlying layer." The first photoresist layer is preferably a positive photoresist layer.

The first photoresist layer is then photolithographically patterned into a first photoresist pattern. Any suitable photolithography methods may be used, such as immersion or non-immersion lithography. The first photoresist pattern comprises a plurality of spaced apart first photoresist features located over the underlying layer. The first photoresist features may have any shape, such as polygonal (square, triangular, rectangular, etc.), oval, circular or irregular shape when viewed from above. The underlying layer is then etched using the first photoresist pattern as a mask to form a plurality of first spaced apart features having approximately the same shape as the first photoresist pattern. For example, the first spaced apart features may comprise either masking features located over the device layer(s) or they may comprise features formed directly in the device layer(s). The first photoresist pattern is then removed.

A second photoresist layer is then formed over the plurality of first spaced apart features. The second photoresist layer is preferably a positive photoresist layer. The second photoresist layer is patterned into a second photoresist pattern, using any suitable photolithography method. The second photoresist pattern comprises a plurality of second photoresist features. The second photoresist features may have the same or different shape from the first photoresist features. The second photoresist features may have any shape, such as polygonal (square, triangular, rectangular, etc.), oval, circular or irregular shape when viewed from above. The second photoresist features may have a smaller size, the same size, or a larger size than the first photoresist features.

The second photoresist features cover edge portions of the plurality of first spaced apart features. As used herein "edge portions" means that each second photoresist feature covers at least a portion of one or more edges of the underlying first spaced apart features while leaving at least a portion of the first spaced apart features exposed. Thus, each second photoresist feature may cover an entire edge or entire two or more edges of the underlying first spaced apart features. Alternatively, each second photoresist feature may cover a portion of one or more edges of the underlying first spaced apart features. Thus, as used herein, the term "edge portion" includes a portion of each first spaced apart feature extending from one end of such feature but not reaching the opposite end of such feature, when such feature is viewed from the top. Thus, at least a portion of each spaced apart feature remains exposed when viewed from the top.

The exposed portions of the plurality of first spaced apart features are then patterned (e.g., etched) using the second photoresist pattern as a mask. After the patterning step, a plurality of spaced apart edge portions of the plurality of first spaced apart features remain. The second photoresist pattern is then removed.

The plurality of spaced apart edge portions may comprise a plurality of spaced apart edge masking features located over the device layer(s). Each edge masking feature has a smaller size than each respective first spaced apart masking feature. The edge masking features are then used as a mask to pattern (e.g., etch) the underlying device layer(s) to form pillar shaped devices in the device layer(s). Alternatively, the plurality of spaced apart edge portions may comprise a plurality of spaced apart edge features located in the device layer(s) (i.e., the edge portions themselves comprise the pillar shaped devices). The edge portions may have any suitable shape, such as polygonal shape (including square, triangular or rectangular shape), oval shape, circular shape or other irregular shape when viewed from above.

For example, as will be described in more detail below, the pillar shaped devices may have a cylindrical shape. However, other shapes, such as rectangular or triangular shape may also be used if rectangular or triangular devices are to be formed. The above described features and pillar shaped devices may have any desired size. If the features are masking features, then they should have a sufficient height or thickness to act as an etching mask. The masking features may comprise a hard mask material, such as an insulating material, such as silicon oxide, silicon nitride, silicon oxynitride and/or amorphous carbon (also referred to as an advanced patterning film, or "APF"), a semiconductor material, such as polysilicon, or an electrically conductive material, such as tungsten, or a combination thereof, such as tungsten covered by a silicon nitride, titanium nitride or other hard mask material. Other materials may also be used.

The masking features and the device layers may be etched using isotropic or anisotropic etching. The edge masking features may be retained in a completed device or removed after etching the device layers. For example, if these features include an electrically conductive material, such as tungsten, then these features may be retained as portions of upper electrodes.

Any suitable devices may be formed. The devices may have a substantially cylindrical and/or substantially rectangular pillar shape, depending on the shape of the features, as will be described in more detail below. Non-pillar shaped devices may also be formed. The devices may comprise diodes, transistors, resistors, antifuse dielectrics, fuses, resistivity-switching materials, capacitors, etc. Logic, volatile memory or nonvolatile memory devices or arrays may be formed. In an embodiment, the pillar shaped devices comprise a plurality of nonvolatile memory cells, where each cell includes a pillar diode steering element and a resistivity switching element (i.e., a storage element). For example the pillar structures described in U.S. application Ser. No. 12/000,758 filed on Dec. 17, 2007 to Petti et. al., which is hereby incorporated by reference in its entirety, may be formed.

In a preferred non-limiting embodiment, a plurality of pillar shaped devices that comprise a plurality of diodes containing nonvolatile memory cells are formed. Referring to FIG. 1, U.S. Pat. No. 6,952,030, issued to Herner et al. and entitled "High-Density Three-Dimensional Memory Cell," hereinafter the "'030 patent" and hereby incorporated by reference in its entirety, discloses an exemplary nonvolatile memory cell which can be formed by the method of the embodiments of the present invention.

The memory cell 20 includes a vertically oriented, cylindrical pillar shaped junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have a p-type semiconductor material and an n-type semiconductor material in contact, such as Zener diodes, and p-i-n diodes, in which an intrinsic (undoped) semiconductor material is interposed between the p-type semiconductor material and the n-type semiconductor material. In other embodiments, layers that include metal-insulator I-insulator 2-metal (m-i1-i2-m) tunneling diodes may be employed. In yet other embodiments and more generally, any non-linear conducting device may be used.

The diode 22 and the resistivity switching element 24 are interposed between top 26 and bottom 28 conductors or electrodes. The vertically oriented junction diode 22 includes a heavily doped semiconductor region 30 of a first conductivity type (such as n-type), an intermediate region 32 which is undoped semiconductor material or lightly doped semiconductor material (which will be referred to as an intrinsic region), and a heavily doped semiconductor region 34 of the second conductivity type (such as p-type) to form a p-i-n diode. If desired, the location of the p and n-type regions may be reversed. The semiconductor material of the junction diode 22 is generally silicon, germanium, or an alloy of silicon and/or germanium. Other semiconductor materials may also be used. The junction diode 22 and the element 24 are arranged in series between the bottom conductor 28 and the top conductor 26, which may be formed of a metal or any other conductor, such as tungsten and/or TiN. The element 24 may be located above or below the diode 22.

The memory cell may comprise a one-time programmable (OTP) or re-writable nonvolatile memory cell. For example, each diode 22 may act as a steering element of a memory cell and the element 24 comprises another material or layer which acts as a resistivity switching material (i.e., which stores the data) is provided in series with the diode between the conductors. Specifically, element 24 may comprise an antifuse dielectric, a fuse, polysilicon memory effect material, metal oxide or switchable complex metal oxides (such as nickel or titanium oxide, perovskite materials, etc.), carbon resistivity switching material (such as carbon nanotubes, microcrystalline carbon, amorphous carbon, graphite or graphene), phase change materials, conductive bridge elements, or switchable polymers. The resistivity of the resistivity switching material of element 24 may be increased or decreased in response to a forward and/or reverse bias provided between the electrodes or conductors.

Briefly, the cell 20 operates as follows. When element 24 is an antifuse dielectric, in the initial state, very little current flows through the junction diode 22 when a read voltage is applied between the top conductor 26 and the bottom conductor 28 because the antifuse dielectric 24 impedes current flow. The application of a programming voltage between the top conductor 26 and bottom conductor 28 causes dielectric breakdown of the anti fuse material, permanently forming a conductive path through the antifuse 24. If the diode semiconductor material is initially formed in a high resistivity state, then the semiconductor material of diode 22 may be altered as well, changing it to a lower-resistivity state. After programming, a higher read current flows between the top conductor 26 and the bottom conductor 28 upon application of a read voltage. In this way, a programmed cell can be distinguished from an unprogrammed cell. Alternatively, rather than using an antifuse dielectric as the element 24, another resistivity switching material, such as a carbon material is provided. Such material's resistivity changes in response to an applied bias, rather than forming a conductive link through the antifuse.

In alternative embodiments, the element 24 may be omitted. Instead, the polycrystalline semiconductor material of diode 22 is formed in a relatively high-resistivity state, which also tends to impede current flow, as described in a U.S. patent application having Ser. No. 10/955,549, "Nonvolatile Memory Cell Without a Dielectric Antifuse Having High- and Low-Impedance States," filed by Herner et al. on Sep. 29, 2004 and hereinafter the "'549 application"; and U.S. patent application having Ser. No. 11/148,530, "Nonvolatile Memory Cell Operating by Increasing Order in Polycrystalline Semiconductor Material," filed by Herner et al. on Jun. 8, 2005 and hereinafter the "'530 application," both hereby incorporated by reference. The application of a programming voltage lowers the resistivity state of the diode. Thus, the diode acts as a resistivity switching material in this embodiment.

Referring to FIG. 2, a portion of a first memory level 36 of memory cells 20 similar to the cell 20 of FIG. 1 is shown. Two, three, four, or more such memory levels, such as eight levels may be formed, stacked one atop the other, to form a monolithic three dimensional memory array, preferably formed above a substrate such as a monocrystalline silicon wafer, and described in the '030 patent and the '549 and '530 applications. The diode pillars 22 preferably have a pitch of less than 100 nm, such as pitch of 78 nm or less and a diameter of 100 nm or less, such as 50 nm or less, such as 32 nm for example.

The bottom electrodes or conductors 28 can be formed either by subtractive or by Damascene methods. In a subtractive method, a conductive layer or film is patterned into spaced apart electrodes and the gaps between the electrodes are then filled with an insulating material. In a Damascene method, grooves are formed in an insulating material, a conductive layer or film is formed in the grooves and over the insulating layer, and then the conductive layer or film is planarized to leave spaced apart electrodes in the grooves.

Figure 3B:
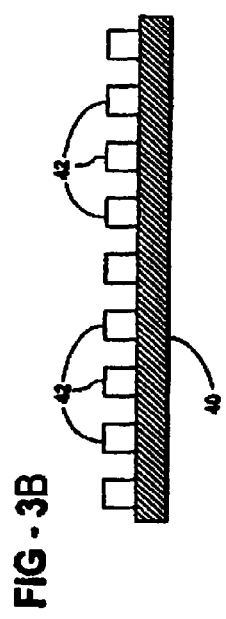
Figure 3C:
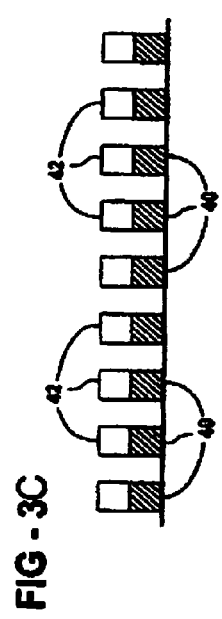
Figure 3D:
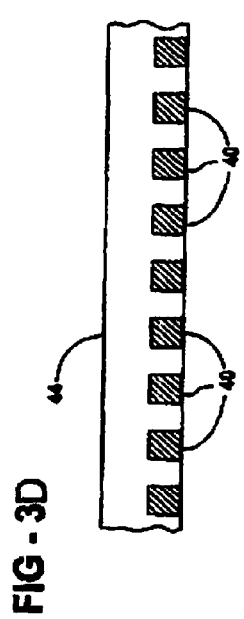

FIGS. 3A-3D illustrate the subtractive method of forming rail-shaped electrodes or conductors 28. As shown in FIG. 3A, one or more conductive layers 40, such as a W and/or a TiN layers are deposited over a substrate, and a layer of photoresist 42 is spun onto it. As shown in FIG. 3B, the layer of photoresist 42 is then photolithographically patterned into the desired form. As shown in FIG. 3C, an etch step removes portions of the conductive layer(s) 40 where they are not protected by etched photoresist layer 42. As shown in FIG. 3D, after the etch, the photoresist layer 42 is stripped, leaving conductor or electrode rails 40 behind. The gaps between the rails 40 are filled with an insulating material 44, such as silicon oxide, silicon nitride or other insulating materials. If desired, any overfill of the insulating material 44 can be removed, for example by chemical-mechanical polishing (CMP), to expose the upper surface of the rails 40 in the planarized surface of the insulating layer 44.

Figure 4A:
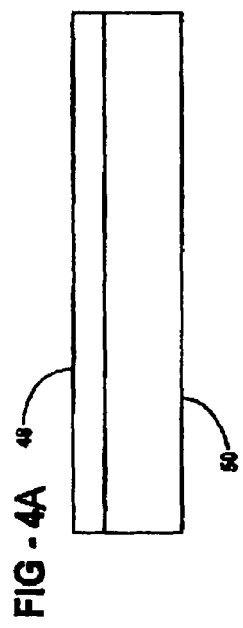
FIGS. 4A through 4D are cross-sectional side views illustrating steps in the process of forming conductive rails by a Damascene method.
Figure 4B:
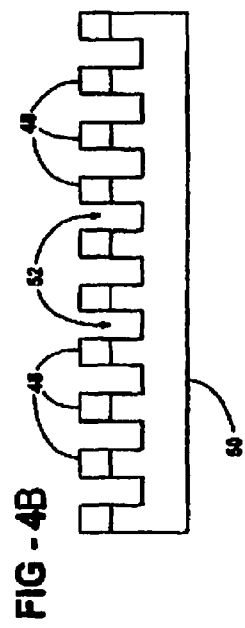
Figure 4C:
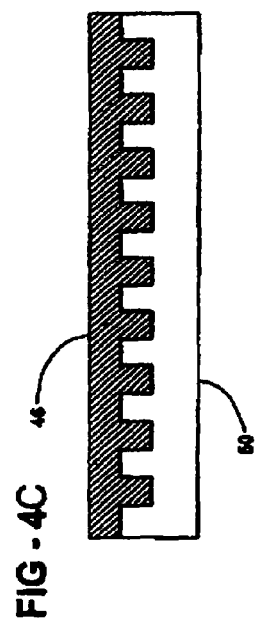
Figure 4D:
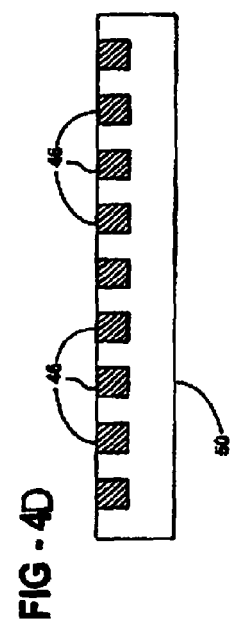

FIGS. 4A to 4D illustrate an example of the Damascene method to form the electrode or conductor 28. First, a layer of photoresist 48 is spun onto a deposited insulating layer 50, such as a silicon oxide layer. As shown in FIG. 4B, the layer of photoresist 48 is patterned. An etch step then forms grooves or trenches 52 in the insulating layer 50. In FIG. 4C, after removal of the photoresist layer 48, one or more conductive layers 46, such as a W and/or TiN layers are deposited to fill the grooves or trenches 52. The one or more conductive layers 46 are planarized, for example by CMP or etchback, with the upper surface of the insulating layer to leave the rail shaped conductors in the grooves, as shown in FIG. 4D.

Figure 5:
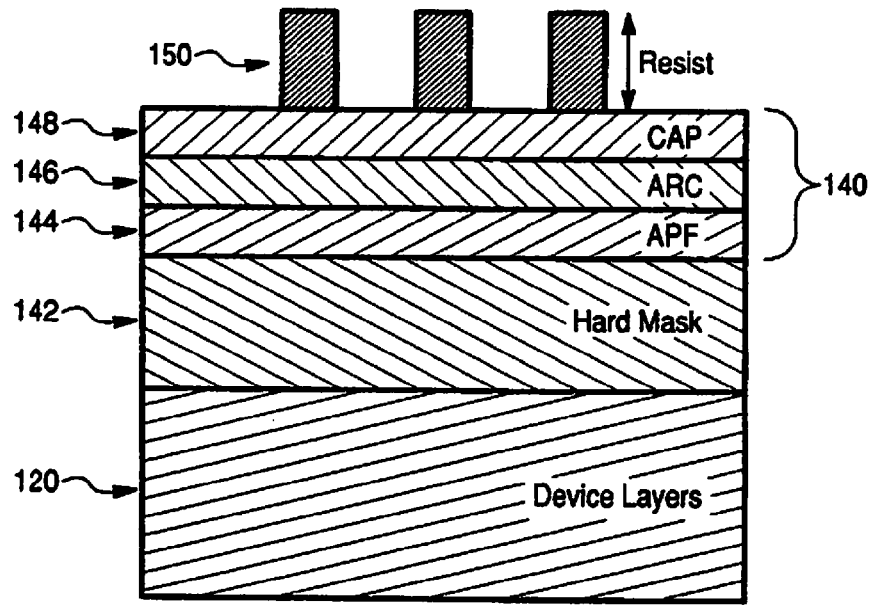
FIG. 5 is a cross-sectional side view of the device layers prior to the formation of the pillar structures.

FIG. 5 shows an initial stage of fabrication of a semiconductor device, such as a pillar shaped nonvolatile memory cell array, according to one embodiment of the invention. The array contains a plurality of device layers 120, including the bottom electrodes formed by the subtractive or Damascene methods described above with respect to FIG. 3 or 4 respectively. The electrodes correspond to the rail shaped conductors 28 shown in FIGS. 1 and 2. The electrodes may comprise any suitable conductive material, such as tungsten, aluminum, their alloys, etc. The electrodes can be separated from each other by an insulating material, such as silicon oxide. An optional adhesion layer may be formed above the electrodes. The adhesion layer may comprise titanium nitride or tungsten nitride. The resistivity switching element 24 and the diode 22 shown in FIG. 1 are formed over the electrodes. The diode comprises one or more semiconductor layers. For example, the semiconductor layers may comprise a lower n-type layer, a middle intrinsic layer and an upper p-type layer. The p-type layer may be formed by ion implantation of p-type dopants into the upper part of the intrinsic layer or by deposition of a p-type doped semiconductor layer on the intrinsic layer. The semiconductor layers may be polycrystalline, amorphous, or single crystalline, and may have a thickness of between about 1000 Å and about 3000 Å, such as between about 1800 Å and 2000 Å. An optional upper adhesion layer, such as a TiN layer, may be formed over the semiconductor layers. The adhesion layer may have a thickness of between about 100 Å and about 300 Å, such as between about 150 Å and about 200 Å. In other embodiments, the diode is a tunneling diode comprising layers that include metal-insulator 1-insulator 2-metal (m-i1-i2-m) tunneling diodes. In yet other embodiments and more generally, any non-linear conducting device may be used.

At least one masking layer 140 is formed over the device layers 120. For example, as shown in FIG. 5, the masking layers 140 comprise a hard mask layer 142, such as a tungsten or a silicon oxide layer, located over the device layers 120, an amorphous carbon advanced patterning film (APF) 144 located over the hard mask layer, an antireflective coating layer 146, such as a silicon oxynitride layer and/or an organic bottom antireflective coating (BARC), located over the amorphous carbon film, and a cap layer 148, such as a silicon oxide layer, located over the antireflective layer. The cap layer 148 is relatively thin, such as 200 to 400 Angstroms, for example about 300 Angstroms thick. Other masking layer combinations may be used. If desired, an optional etch stop layer may be formed between the device layers 120 and the masking layer 140.

Figure 6A:
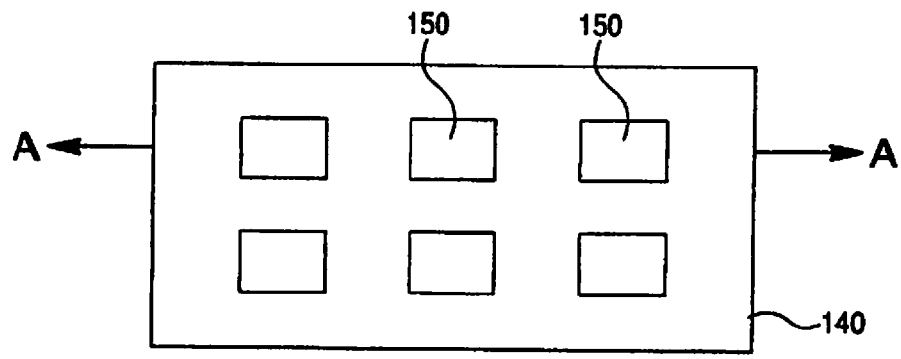
FIGS. 6A, 8C, 9D, 11B and 12B are top views of process steps of making a device array according to the embodiments of the invention.
Figure 6B:
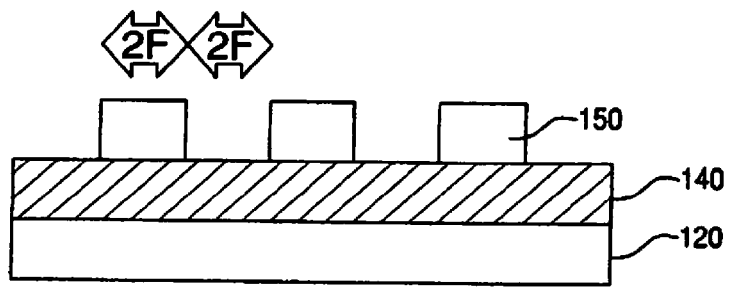
FIGS. 6B, 7A, 7B, 8A, 8B, 9A, 9B, 9C, 10, 11A and 12A are side cross-sectional views

A first photoresist layer is formed over the masking layers 140. The first photoresist layer is patterned into the first photoresist pattern having spaced apart first photoresist features 150, as shown in FIGS. 5, 6A and 6B. FIG. 6B is a side cross sectional view along line A-A in the top view of FIG. 6A.

Figure 7A:
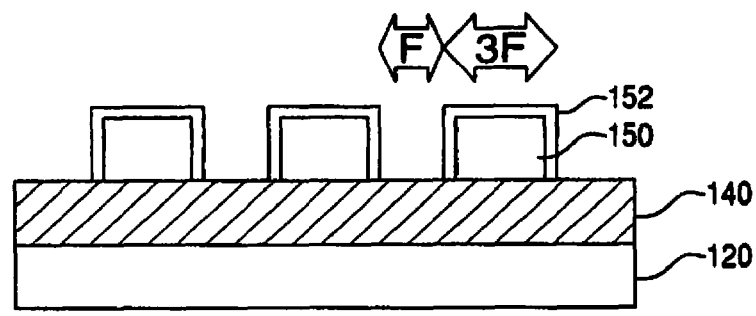

In a first optional embodiment of the invention, the size of the first photoresist features is increased such that a distance between adjacent first photoresist features 150 is reduced. The size of the photoresist features 150 may be increased by a reflow process or by a Resolution Enhancement Lithography Assisted by Chemical Shrink ("RELACS") process. In a reflow process, the photoresist features 150 are annealed such that they flow sideways increasing their size. If a reflow process is used, the corners of the features 150 may become rounded, so that the features may have a roughly oval or roughly circular shape when viewed from the top. In a RELACS process, a liquid coating is provided onto the features 150 and then crosslinked with the features 150 to increase the feature size. Examples of such coatings are sold by AZ Electronic Materials, under license from Mitsubishi Chemicals. The increased size portions 152 of the features 150 are shown in FIG. 7A. Alternatively, in order to increase the size of the features 150, sidewall spacers 152 may be formed on the features 150. The sidewall spacers may be formed by coating a layer of material over the features without collapsing the features followed by selective anisotropic spacer etch of the layer.

For example, each pattern 150 may have a square shape (when viewed from above) having a side length of 2 F (where F is the minimum feature size (e.g., 0.18 microns in a 0.18 micron semiconductor process and 0.25 microns in a 0.25 micron semiconductor process). Adjacent patterns 150 may be separated by a distance 2 F. After the size of the features 150 is increased to add portions 152, the distance between adjacent first photoresist features 150/152 is reduced from about 2 F to about 1 F, while a side length of each feature 150/152 is increased from 2 F to 3 F, as shown in FIG. 7A.

Figure 7B:
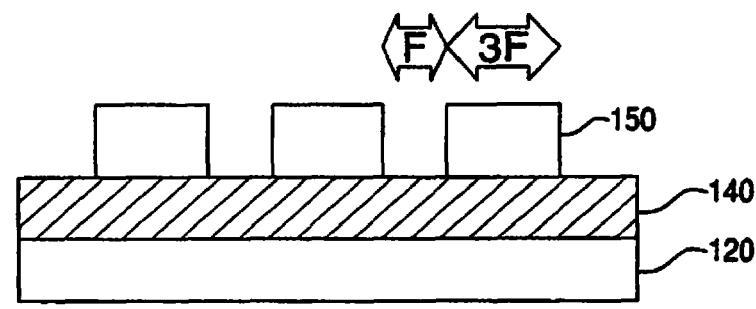

In a second optional embodiment of the present invention, the size increase step of FIG. 7A is omitted. Instead, as shown in FIG. 7B, larger photoresist features 150 with smaller spaces between such features are formed during the photoresist layer exposure and patterning step. For example, instead of using reflow or RELACS to form photoresist features 150/152 with a side length of 3 F and a distance of 1 F between the adjacent features, the first photoresist layer is simply patterned to form features 150 having a side length of 3 F and a distance of 1 F. Of course other side lengths and distances may be used.

Figure 8A:
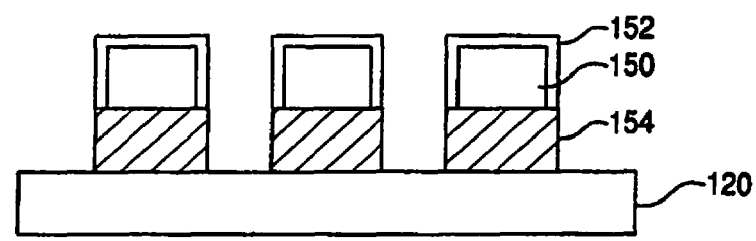
Figure 8B:
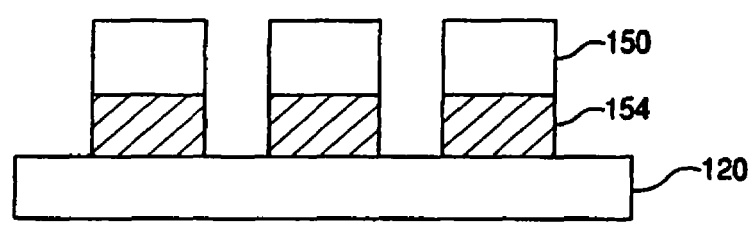

The photoresist features 150 (or 150/152) shown in FIG. 6B or 7A or 7B are then used as a mask to etch at least one masking layer 140, such as to etch at least the cap layer 148 to form the first spaced apart masking features 154, as shown in FIGS. 8A and 8B. FIG. 8A illustrates the use of features 150/152 of FIG. 7A as a mask to etch the masking features 154. FIG. 8B illustrates the use of features 150 of FIG. 7B as a mask to etch the masking features 154. Optionally, one or more of the layers 142-146 may also be etched and be included as part of the first masking features 154. The first photoresist features 150 or 150/152 are removed after forming the masking features 154, as shown in a top view in FIG. 8C.

Figure 8C:
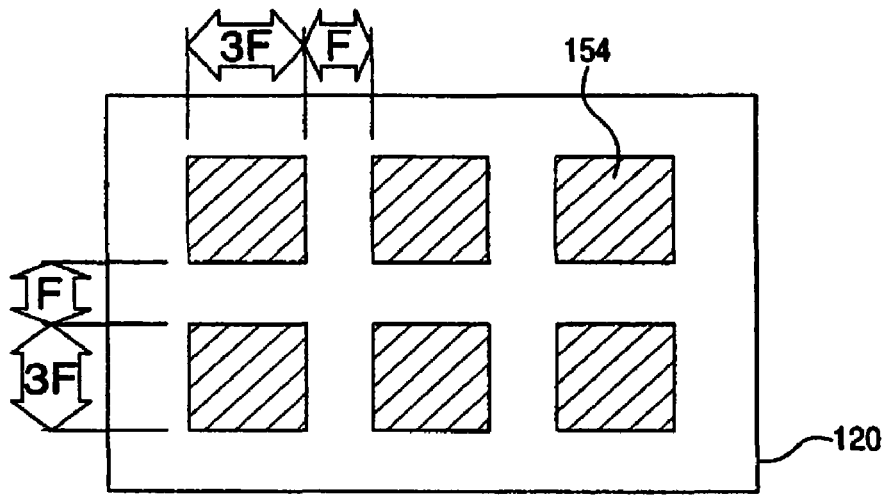

Preferably, the length or width of each first spaced apart features 154 is greater than space between adjacent first spaced apart features 154. For example, the width of each first spaced apart features 154 is about 3 F and a space between adjacent first spaced apart features is about 1 F, as shown in FIG. 8C.

Figure 9A:
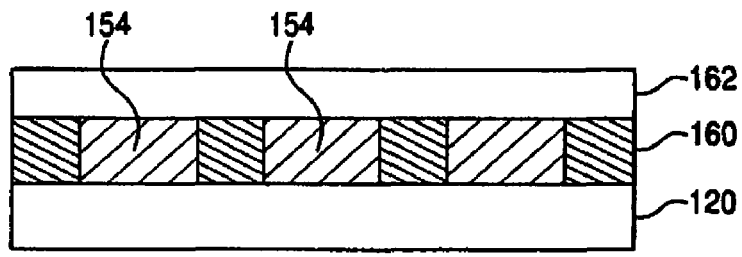
Figure 9B:
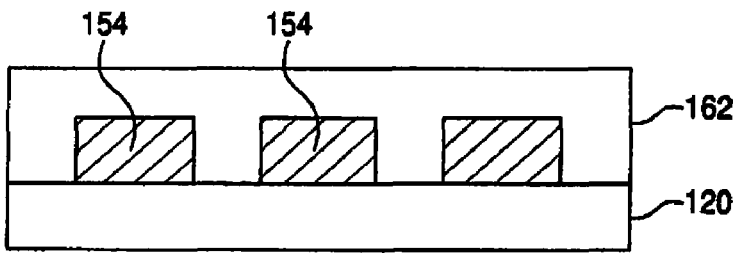

In a third optional embodiment, a filler material layer 160 is formed over the plurality of first spaced apart features 154 and in spaces between the plurality of first spaced apart features 154. The filler material layer 160 can be any material layer that can be preferentially etched compared to the material of the features. For example, layer 160 may comprise silicon oxide if the features 154 comprise tungsten. Alternatively, layer 160 may comprise silicon nitride if the features 154 comprise silicon oxide. The filler material layer 160 is then planarized by chemical mechanical polishing (CMP) or other planarization methods to expose upper surfaces of the plurality of first spaced apart features 154, as shown in FIG. 9A. Alternatively, the filler material 160 may be omitted, as shown in FIG. 9B.

Then, a second photoresist layer 162 is formed over the plurality of first spaced apart features 154. If the filler material 160 is present, then the second photoresist layer 162 is formed over the plurality of first spaced apart features 154 and over the filler material 160, as shown in FIG. 9A. If the filler material 160 is omitted, then the second photoresist layer 162 is simply formed over the plurality of first spaced apart features 154 and fills spaces between adjacent first spaced apart features 154, as shown in FIG. 9B.

Figure 9C:
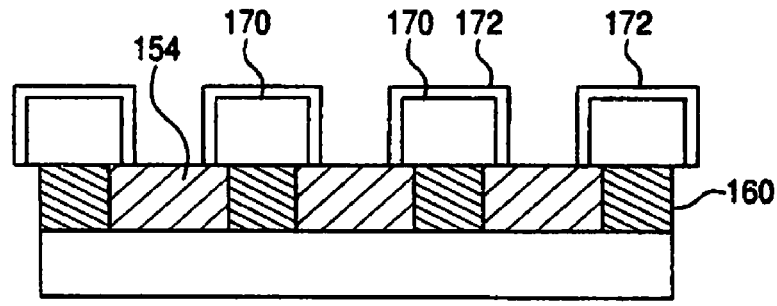
Figure 9D:
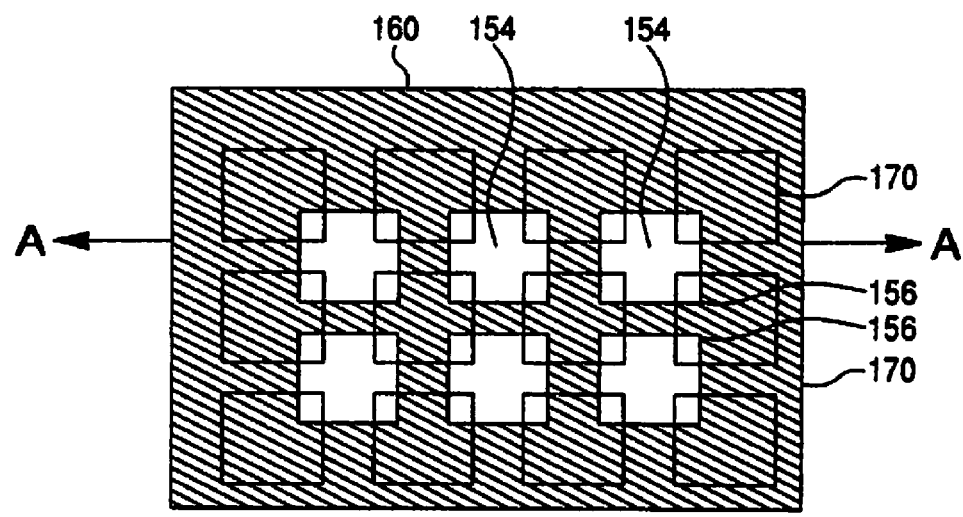

The second photoresist layer is patterned into a second photoresist pattern which comprises a plurality of second photoresist features 170, as shown in FIGS. 9C and 9D. FIG. 9C is a side cross sectional view along line A-A in the top view in FIG. 9D. The second photoresist layer is patterned such that the plurality of second photoresist features 170 cover edge portions of the plurality of first spaced apart features 154 and cover at least a portion of the filler material 160 (if material 160 is present). In other words, the second photoresist features 170 cover only a portion of the filler material 160, as shown in FIG. 9D.

As shown in FIGS. 9C and 9D, the second photoresist features 170 may cover edge portions 156 of the plurality of first spaced apart features 154. For example, as shown in FIG.

9D, square features 170 cover corner portions 156 of square masking features 154. Other shapes of the features 154 and 170 and edge portions 156 may also be used. The features 170 that cover the edge portions 156 may be formed using different methods.

In an fourth optional embodiment, the size of the second photoresist features 170 may be increased such that a distance between adjacent second photoresist features 170 is reduced after the features 170 are formed. The size of the features 170 may be increased by reflow or RELACS processes, as described above with respect to FIG. 7A. The increased size portions 172 of the features 170 are shown in FIG. 9C. After the size of the features 170 is increased to add portions 172, the distance between adjacent first photoresist features 170/172 is reduced from about 2 F to about 1 F, while a side length of each feature 170/172 is increased from 2 F to 3 F. Optionally, in this embodiment, the original second photoresist features 170 do not extend over an appreciable amount of the edge portions 156 of the first spaced apart features 154, such as the masking features 154. However, the step of increasing the size of the second photoresist features 170 forms the side portions 172 which extend over the edge portions 156 of the plurality of first spaced apart features 154, as shown in FIG. 9C.

In a fifth optional embodiment of the present invention, the size increase step is omitted. Instead, larger photoresist features 170 with smaller spaces between such features are formed during the photoresist layer exposure and patterning step, similar to the process shown in FIG. 7B for the first photoresist features 150. For example, instead of using reflow or RELACS to form photoresist features 170/172 with a side length of 3 F and a distance of 1 F between the adjacent features, the second photoresist layer is simply patterned to form features 170 having a side length of 3 F and a distance of 1 F, as shown in FIG. 9D. Of course other side lengths and distances may be used.

Figure 10:
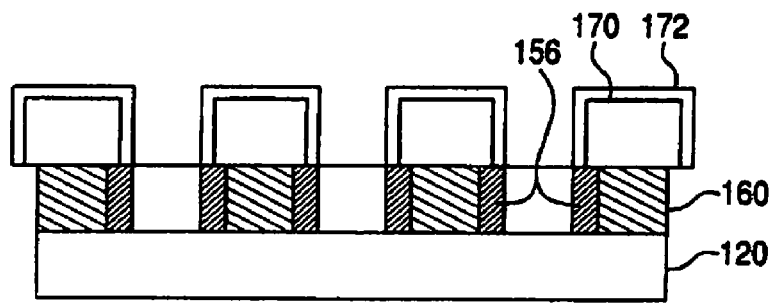

The exposed portions of the plurality of first spaced apart features 154 are then patterned (e.g., etched) using the photoresist features 170 (or 170/172) as a mask. After the patterning step, a plurality of spaced apart edge portions 156 of the plurality of first spaced apart features 154 remain, as shown in FIG. 10. The second photoresist pattern (i.e., features 170 or 170/172) is then removed.

Figure 11A:
Figure 11B:
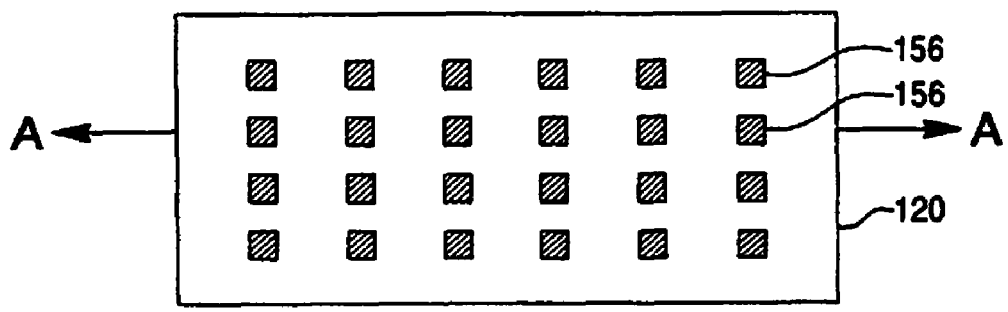

If the filler material 160 is present, then it may also be selectively removed after the photoresist features 170 or 170/172 are removed to leave a plurality of spaced apart edge portions 156, as shown in FIGS. 11A and 11B. FIG. 11A is a side cross sectional view along line A-A in FIG. 11B.

Figure 12A:
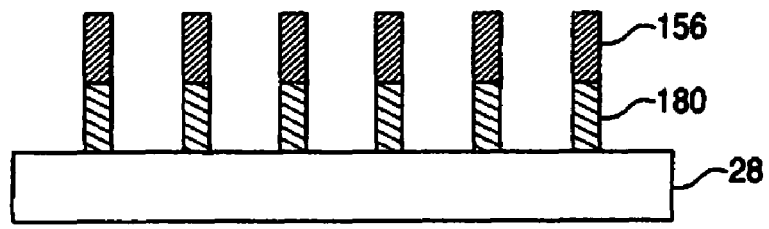
Figure 12B:
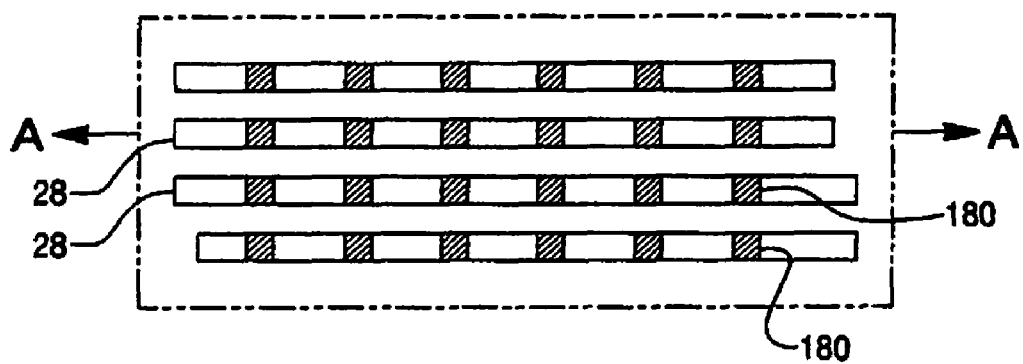

The edge masking portions 156 may comprise masking edge features, such as square shapes having a 1 F size and separated by a 1 F distance, as shown in FIG. 11B. Masking edge features 156 are then used as a mask to etch the underlying device layers 120, as shown in FIGS. 12A and 12B and/or to etch additional masking layers 142-146. Preferably, the edge masking features 156 comprise portions of the cap layer 148. If desired, the features 156 may also include the APF 144 and antireflective 146 layers. The edge feature 156 pattern in layer 148 or in layers 144/146/148 may be transferred to the hard mask layer 142. This pattern is then transferred to the device layers 120 using the pattern in layer 142 as a mask before or after any one or more layers 144, 146 or 148 are removed, as shown in FIGS. 12A and 12B. As shown in FIGS. 12A and 1213, pillar shaped devices 180 are formed from the device layers 120 on rail shaped bottom electrodes 28. The pillar shaped devices 180 may comprise, for example, a memory cell comprising the diode steering element 22 and the memory storage element 24 shown in FIG. 1. While square pillar shaped devices 180 are shown, the pillars may have other shapes, such as other polygonal, oval, irregular or circular shapes when viewed from above.

The hard mask layer 142 masking features 156 may be either retained in the final devices 180 or removed after the formation of the pillar devices. For example, if layer 142 is conductive, then its features 156 may be retained in contact with the upper part of the pillar shaped devices 180. The upper conductors or electrodes 26 shown in FIG. 1 are then formed in contact with the features of layer 142. For example, 400-500 Å of tungsten features may remain in the device. Alternatively, hard mask layer 142 masking features may be removed prior to formation of the upper conductors or electrodes 26 shown in FIG. 1. The upper conductors or electrodes 26 may be formed on devices 180 by the subtractive or the Damascene processes described above with respect to FIG. 3 or 4. An insulating filler material, such as silicon oxide, etc., may be formed between the pillars prior to forming the upper electrodes 26.

In the second and fifth optional embodiments, the 3 F and 1 F measurements are merely exemplary and other measurements may be used. The photoresist features are preferably greater than 2 F in shape size and less than 2 F in space or distance between adjacent features so that the bias achieved in photoresist or etching the layers is less than the one half F desired. The amount of bias in photoresist etching is primarily determined by the materials and processing tools. As processes scale to smaller and smaller geometries, the bias becomes a larger fraction of F. At 30 nm feature size, about 2.7 F feature sizes and 1.3 F spaces between features with a total bias of 9 nm may be used to achieve about 3 F feature size and 1 F space in the masking layer(s) below the photoresist pattern. At smaller geometries, for example 15 nm, the mask pattern would be 2.4 F with the same total bias of 9 nm giving a final 3 F shape in the masking layer(s). Other combinations of lithography shape and total bias may be used to achieve the desired shape and space in the hard mask. The optimum choice is dependent on the specific photolithography tool and processing equipment and material choices and such optimization is well known in the art.

In the above described embodiments, each of the plurality of first spaced apart masking features 154 has a square or rectangular shape. These features 154 are arranged in a grid configuration. The plurality of spaced apart edge masking features 156 comprise corner portions of the plurality of first spaced apart masking features 154. Thus, in these methods, both the first and the second photoresist features 150, 170 comprise square or rectangular features which are arranged in a chess-board type grid. The second photoresist features 170 are offset diagonally with respect to adjacent first photoresist features 150 such that their respective positions over the substrate overlap in corner regions where the edge masking features 156 are formed. For example, the features 156 may have a square shape a width and length of 1 F and be spaced apart by a distance of 1 F. Other shapes, sizes and distances may also be used. Corner rounding on the square shapes can make the final device pillar 180 a 1 F by 1 F feature rounded on two diagonal corners so that it has a "football" or "rugby ball" shape which comprise an irregular oval shape with two pointed edges. This occurs if both photoresist features 150, 170 are rounded by reflow and thus two of four corners of features 156 are rounded due to an overlap of positions of circular features 150, 170, as shown in FIG. 14.

An alternative embodiment using circular or oval shaped features instead of square or rectangular features is described below.

FIG. 13 illustrates a plurality of first features 254 having a circular shape when viewed from above. The first features are arranged at vertices of imaginary equilateral triangles such that three adjacent features 254 form an imaginary equilateral triangle 255, with two equilateral triangles sharing a common edge making up the smallest repeating unit of the pattern. The larger pattern may be viewed as a repeating hexagonal pattern with one of six features 254 at each hexagon vertex and a seventh feature at the middle of each hexagon.

Each circle feature 254 may have a diameter of about 3 F and be separated from six adjacent circle patterns by a distance of about 1 F (allowing for variations and tolerances in photolithography). A distance between centers of adjacent features 254 is about 4 F. Thus, the imaginary equilateral triangles 255 may have sides having a size of about 4 F, as shown in FIG. 13.

Such features 254 may be formed by first forming first photoresist features having a diameter of 2 F and then increasing the diameter of the first photoresist features to 3 F by a RELACS, reflow or sidewall spacer process, as described in prior embodiments. Alternatively, photoresist features with a 3 F diameter may be formed by initial patterning. These first photoresist features are then used as a mask to pattern the underlying layer(s) to form features 254 in the underlying layer(s).

Figure 15:
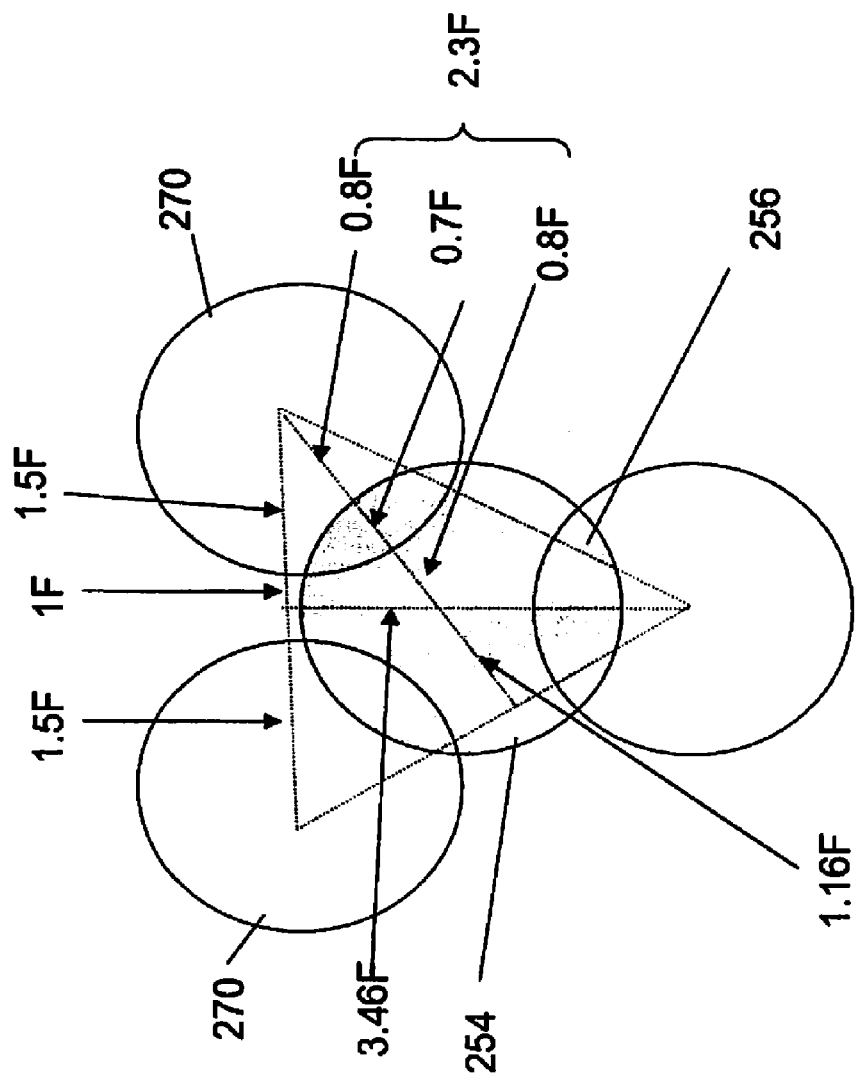

The second photoresist pattern comprising second photoresist features 270 are then formed over the first features 254, as shown in FIGS. 14 and 15. FIG. 15 is a close up of one first feature 254 shown in FIG. 14. The second patterning may be shifted by about 2.3 F (0.8 F+0.7 F+0.8 F), along a perpendicular bisector of the triangles as shown in FIG. 15. The edge features 256 are formed at three overlaps of each first feature 254 and three adjacent second photoresist features 270. The density is one edge feature 256 every 4.6 $F^2$. A minor diameter of each irregular oval shaped edge portion 256 is about 0.7 F. Other dimensions may also be used.

The arrangement shown in FIGS. 14 and 15 gives a slightly less dense arrangement of pillars but allows patterning closer to the photolithography limits. The edge features 256 may comprise either edge masking features which are used to pattern the underlying device layer(s) to form pillars, or the edge features 256 may comprise device pillars, as described with respect to the prior embodiments. The pillars formed by the method of this embodiment may have the irregular oval (e.g., "football" or "rugby ball") shape due to the shape of the edge features.

In summary, in the above described embodiment, each of the plurality of first spaced apart features 254 has a circular shape. The plurality of first spaced apart features 254 are arranged in a hexagonal configuration in which each first spaced apart feature 254 is surrounded by six equidistant nearest neighbor first spaced apart features 254. The plurality of second photoresist features 270 are arranged over the plurality of first spaced apart features 254 such that three second photoresist features 270 form an equilateral triangle 255 covering three edge portions 256 of each first spaced apart feature 254. Thus, the plurality of spaced apart edge portions 256 comprise irregular oval shaped edge portions of the plurality of first spaced apart features 254.

Figure 16:
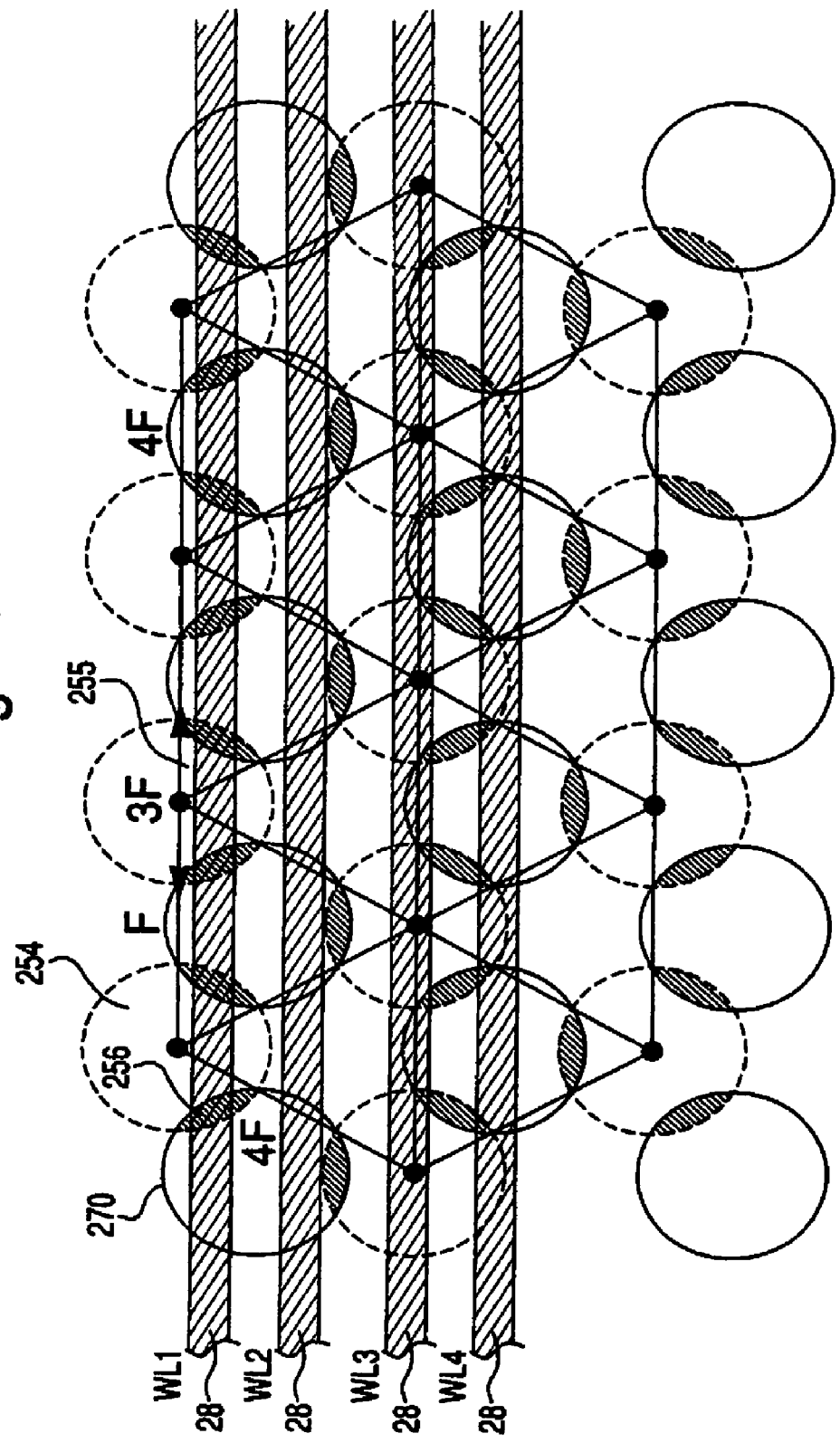
Figure 17:
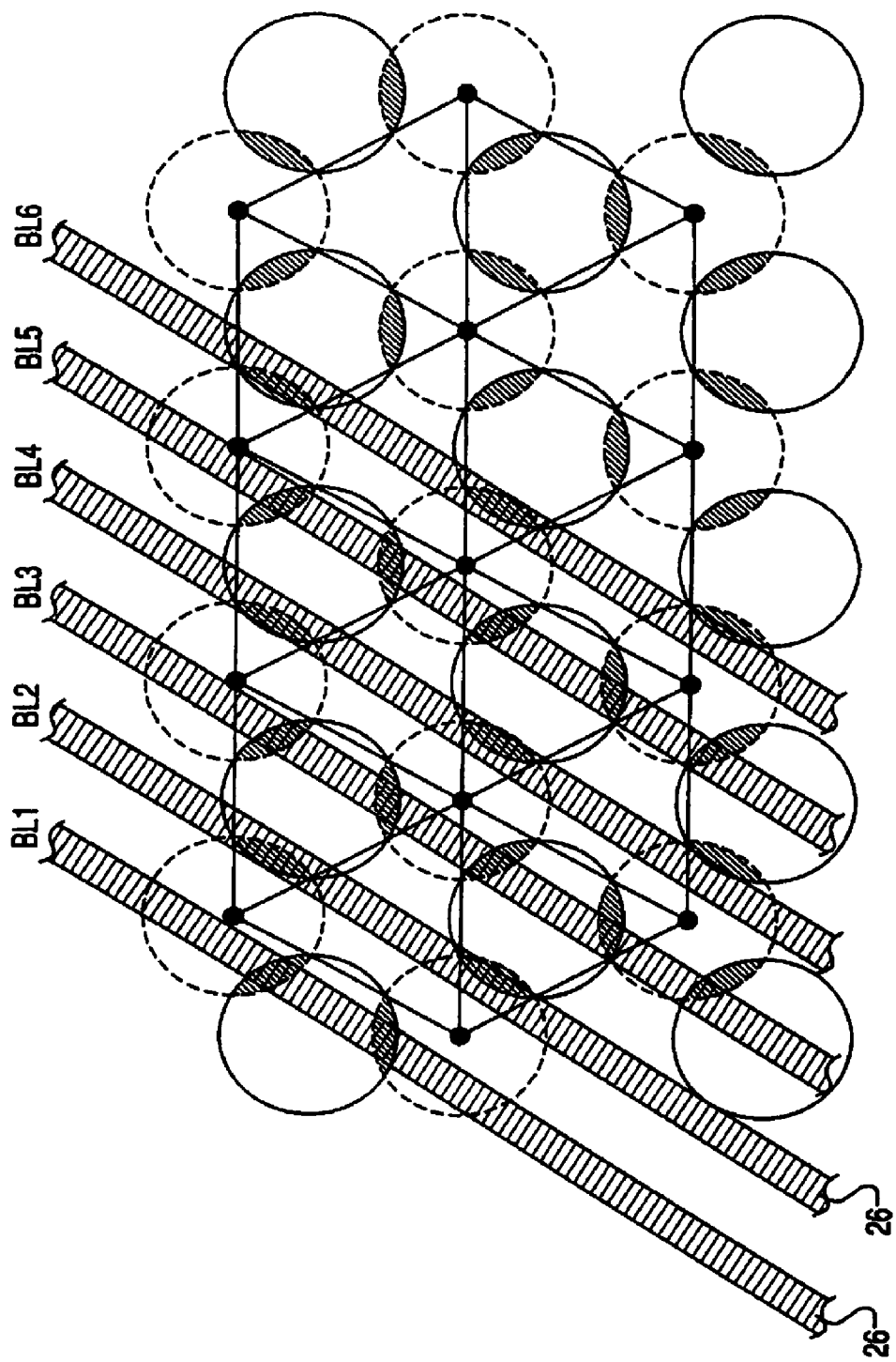

FIGS. 16 and 17 show a preferred arrangement of array lines, such as word lines 28 shown in FIG. 16 and bit lines 26 shown in FIG. 17. It should be noted that the relative orientation of word and bit lines may be reversed. Furthermore, while word lines are shown as being located below the pillar devices and the bit lines as being located above the pillar devices, the positions of the word and bit lines may be reversed. The spacing of array lines is tighter than in an orthogonal arrangement of array lines of the previous embodiment, but the spacing to adjacent pillars is relaxed by orienting the word lines parallel to one side of the triangles 255 and orienting the bit lines parallel to another side of the triangles 255. For example, the word lines 28 can be arranged along the "horizontal" sides of the triangles (or "vertical" sides of the triangles if the substrate is rotated by 90 degrees) and the bit lines 26 extend at an angle about 60 degrees with respect to the word line direction (or vice-versa). Of course, both bit lines and word lines may extend along the two "diagonal" sides (but not along the "horizontal" side) of the triangles 255 shown in FIGS. 16 and 17.

There are twice as many cells (such as memory cell pillars 22 shown in FIG. 1) associated with odd array lines compared to even array lines. Thus, the plurality of word lines 28 comprise a set of first word lines and a set of second word lines. Each first word line (such as word lines WL1 and WL3 shown in FIG. 16) is located between two second word lines (such as word lines WL2 and WL4). Each first word line (WL1, WL3) electrically contacts twice as many pillar devices as each second word line (WL2, WL4). The same is applicable to the bit lines 26 shown in FIG. 17. Cell address decoding is adjusted for the varying number of cells on an array line by precalculating the desired array line selection in support logic. Any of the well known methods in the art binary decode circuit may be used.

Formation of a first memory level has been described. Additional memory levels can be formed above this first memory level to form a monolithic three dimensional memory array. In some embodiments, conductors can be shared between memory levels; i.e. top conductor would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Throughout this description, one layer has been described as being "above" or "below" another. It will be understood that these terms describe the position of layers and elements relative to the substrate upon which they are formed, in most embodiments a monocrystalline silicon wafer substrate; one feature is above another when it is farther from the wafer substrate, and below another when it is closer. Though clearly the wafer, or the die, can be rotated in any direction, the relative orientation of features on the wafer or die will not change. In addition, the drawings are purposefully not shown to scale and are merely representative of layers and processed layers.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

We claim:

1. A method of making a semiconductor device, comprising:
   forming a first photoresist layer over an underlying layer and a device layer;
   patterning the first photoresist layer into a first photoresist pattern, wherein the first photoresist pattern comprises a plurality of spaced apart first photoresist features located over the underlying layer;
   etching the underlying layer using the first photoresist pattern as a mask to form a plurality of first spaced apart features;
   removing the first photoresist pattern;
   forming a second photoresist layer over the plurality of first spaced apart features;
   patterning the second photoresist layer into a second photoresist pattern, wherein the second photoresist pattern comprises a plurality of second photoresist features covering edge portions of the plurality of first spaced apart features;
   etching exposed portions of the plurality of first spaced apart features using the second photoresist pattern as a mask, such that a plurality of spaced apart edge portions of the plurality of first spaced apart features remain;
   removing the second photoresist pattern; and
   etching the device layer using the plurality of spaced apart edge portions as a mask to form a plurality of pillar devices;
   wherein the plurality of pillar devices comprise a plurality of nonvolatile memory cells, each cell comprising a pillar diode steering element and a resistivity switching element.

2. The method of claim 1, wherein:
   the underlying layer comprises at least one masking layer located over the device layer;
   the plurality of first spaced apart features comprise a plurality of spaced apart masking features;
   the plurality of spaced apart edge portions comprise a plurality of spaced apart edge masking features; and
   each edge masking feature having a smaller size than each respective masking feature.

3. The method of claim 2, wherein the step of etching the device layer comprises etching the device layer using the plurality of edge masking features as a mask to form the plurality of pillar devices.

4. The method of claim 2, wherein the at least one masking layer comprises a hard mask layer located over the device layer, an amorphous carbon patterning film located over the hard mask layer, an antireflective layer located over the amorphous carbon patterning film, and a cap layer located over the antireflective layer.

5. The method of claim 1, further comprising:
   increasing a size of the first photoresist features prior to the step of etching the underlying layer such that a distance between adjacent first photoresist features is reduced; and
   increasing a size of the second photoresist features prior to the step of etching the exposed portions of the first plurality of spaced apart features such that a distance between adjacent second photoresist features is reduced.

6. The method of claim 5, wherein the steps of increasing the size of the first and the second photoresist features comprise increasing the size of the first and the second photoresist features by a reflow process or a RELACS process.

7. The method of claim 5, wherein:
   the distance between adjacent first photoresist features is reduced from about 2 F to about 1 F; and
   the distance between adjacent second photoresist features is reduced from about 2 F to about 1 F.

8. The method of claim 5, wherein the step of increasing the size of the second photoresist features comprises extending the second photoresist features over the edge portions of the plurality of first spaced apart features.

9. The method of claim 1, wherein the step of forming the second photoresist layer comprises forming the second photoresist layer over the plurality of first spaced apart features and filling spaces between adjacent first spaced apart features with the second photoresist layer.

10. The method of claim 1, wherein a width of each first spaced apart features is greater than space between adjacent first spaced apart features.

11. The method of claim 10, wherein a width of each first spaced apart features is about 3 F and a space between adjacent first spaced apart features is about 1 F.

12. The method of claim 1, wherein:
   each of the plurality of first spaced apart features has a square or rectangular shape;
   the plurality of first spaced apart features are arranged in a grid configuration; and
   the plurality of spaced apart edge portions comprise corner portions of the plurality of first spaced apart features.

13. The method of claim 1, wherein the first photoresist layer comprises a positive first photoresist layer and the second photoresist layer comprises a positive second photoresist layer.

14. A method of making a semiconductor device, comprising:
   forming a first photoresist layer over an underlying layer;
   patterning the first photoresist layer into a first photoresist pattern, wherein the first photoresist pattern comprises a plurality of spaced apart first photoresist features located over the underlying layer;
   etching the underlying layer using the first photoresist pattern as a mask to form a plurality of first spaced apart features;
   removing the first photoresist pattern;
   forming a second photoresist layer over the plurality of first spaced apart features, wherein the step of forming the second photoresist layer comprises forming the second photoresist layer over the plurality of first spaced apart features and filling spaces between adjacent first spaced apart features with the second photoresist layer;
   patterning the second photoresist layer into a second photoresist pattern, wherein the second photoresist pattern comprises a plurality of second photoresist features covering edge portions of the plurality of first spaced apart features;
   etching exposed portions of the plurality of first spaced apart features using the second photoresist pattern as a mask, such that a plurality of spaced apart edge portions of the plurality of first spaced apart features remain; and
   removing the second photoresist pattern.

15. The method of claim 14, further comprising:
etching a device layer using the plurality of spaced apart edge portions as a mask; wherein:
the underlying layer comprises at least one masking layer located over the device layer;
the plurality of first spaced apart features comprise a plurality of spaced apart masking features;
the plurality of spaced apart edge portions comprise a plurality of spaced apart edge masking features; and
each edge masking feature having a smaller size than each respective masking feature.

16. The method of claim 15, wherein etching the device layer using the plurality of edge masking features as a mask forms a plurality of pillar devices.

17. A method of making a semiconductor device, comprising:
forming a first photoresist layer over an underlying layer;
patterning the first photoresist layer into a first photoresist pattern, wherein the first photoresist pattern comprises a plurality of spaced apart first photoresist features located over the underlying layer;
etching the underlying layer using the first photoresist pattern as a mask to form a plurality of first spaced apart features, wherein each of the plurality of first spaced apart features has a square or rectangular shape, and the plurality of first spaced apart features are arranged in a grid configuration;
removing the first photoresist pattern;
forming a second photoresist layer over the plurality of first spaced apart features, wherein the step of forming the second photoresist layer comprises forming the second photoresist layer over the plurality of first spaced apart features and filling spaces between adjacent first spaced apart features with the second photoresist layer;
patterning the second photoresist layer into a second photoresist pattern, wherein the second photoresist pattern comprises a plurality of second photoresist features covering edge portions of the plurality of first spaced apart features, wherein the plurality of spaced apart edge portions comprise corner portions of the plurality of first spaced apart features;
etching exposed portions of the plurality of first spaced apart features using the second photoresist pattern as a mask, such that a plurality of spaced apart edge corner portions of the plurality of first spaced apart features remain;
etching a device layer using the plurality of spaced apart edge portions as a mask; and
removing the second photoresist pattern.

18. The method of claim 17, wherein:
the underlying layer comprises at least one masking layer located over the device layer;
the plurality of first spaced apart features comprise a plurality of spaced apart masking features;
the plurality of spaced apart edge portions comprise a plurality of spaced apart edge masking features; and
each edge masking feature having a smaller size than each respective masking feature.

19. The method of claim 18, wherein etching the device layer using the plurality of edge masking features as a mask forms a plurality of pillar devices.

20. The method of claim 17, wherein the corner portions are square or rectangular when viewed from above and are located at corners of square or rectangular first features.

* * * * *